United States Patent
Giunco et al.

(10) Patent No.: US 7,394,885 B2
(45) Date of Patent: Jul. 1, 2008

(54) SPREAD-SPECTRUM CLOCK SIGNAL GENERATOR

(75) Inventors: Fabio Giunco, Tortona (IT); Daniele Gardellini, Guanzate (IT); Massimo Ballerini, Vimercate (IT)

(73) Assignee: Accent S.R.L., Vimercate (IT)

(*) Notice: Subject to any disclaimer, the term of this patent is extended or adjusted under 35 U.S.C. 154(b) by 566 days.

(21) Appl. No.: 10/835,237

(22) Filed: Apr. 28, 2004

(65) Prior Publication Data
US 2005/0013343 A1    Jan. 20, 2005

(30) Foreign Application Priority Data
Apr. 28, 2003   (EP)   ................... 03425257

(51) Int. Cl.
*H03D 3/24*   (2006.01)
(52) U.S. Cl. .................. 375/376; 332/127
(58) Field of Classification Search ........... 332/127, 332/128, 117, 144; 375/130, 354, 362, 371, 375/373, 375
See application file for complete search history.

(56) References Cited

U.S. PATENT DOCUMENTS

| 5,631,920 | A |   | 5/1997 | Hardin |   |
|---|---|---|---|---|---|
| 5,909,144 | A | * | 6/1999 | Puckette et al. | ............. 327/551 |
| 5,943,382 | A | * | 8/1999 | Li et al. | ....................... 375/376 |
| 6,046,646 | A |   | 4/2000 | Lo et al. |   |
| 6,141,163 | A |   | 10/2000 | Nakamura et al. |   |
| 6,294,936 | B1 |   | 9/2001 | Clementi |   |
| 7,298,808 | B1 | * | 11/2007 | Rey | ........................... 375/372 |
| 2004/0056724 | A1 | * | 3/2004 | Arp | ............................. 331/34 |

OTHER PUBLICATIONS

Michel J-Y et al. "A frequency modulated PLL for EMI reduction in embedded application", ASIC/SOC Conference, 1999, Proceedings. Twelfth Annual IEEE International Washington, DC, USA Sep. 15-18, 1999, Piscataway, NJ, USA, IEEE, US Sep. 15, 1999, pp.362-365.

European Search Report for EP 03 42 5257 dated Oct. 8, 2003.

* cited by examiner

*Primary Examiner*—Naheed Ejaz
*Assistant Examiner*—Chieh M. Fan
(74) *Attorney, Agent, or Firm*—Graybeal Jackson Haley LLP (57) ABSTRACT

A spread-spectrum clock signal generator includes a circuit loop receiving a reference signal at a reference frequency and adapted to generate an output signal at an output frequency dependent on and locked to the reference frequency, and a modulator circuit generating a modulation signal at a modulation frequency; the modulation signal is injected into the circuit loop to induce a modulation of the frequency of the output signal with respect to the frequency dependent on the reference frequency. The circuit loop is a frequency-locked loop and has a bandwidth sufficiently higher than the modulation frequency, so that the output frequency tracks the modulation signal. Frequency-offset correction circuit is further provided, for evaluating a frequency offset between an average frequency of the output signal and the frequency dependent on the reference frequency, and for generating a frequency-offset correction signal which is injected into the circuit loop for correcting the evaluated frequency offset.

10 Claims, 5 Drawing Sheets

SPREAD-SPECTRUM CLOCK SIGNAL GENERATOR

PRIORITY CLAIM

This application claims priority from European patent application No. 03425257.7, filed Apr. 28, 2003, which is incorporated herein by reference.

FIELD OF THE INVENTION

The present invention generally relates to methods and systems for reducing electromagnetic emissions by electronic circuits, and particularly to methods and systems based on the so-called Spread-Spectrum Technology (shortly, SST). Even more particularly, the invention concerns a spread-spectrum clock signal generator.

BACKGROUND OF THE INVENTION

Electromagnetic emissions by electronic equipments and appliances are highly undesired, because they are a cause of disturb (interference) of the operation of other electronic equipments. In some cases, electromagnetic emissions are even harmful to the human body.

Many national and international regulatory authorities have therefore issued prescriptions (generally referred to as ElectroMagnetic Interference or, shortly, EMI regulations) aiming at setting maximum limits to the level of electromagnetic emissions by electronic circuits and apparatuses. Reducing as far as possible the level of electromagnetic emissions is therefore a major issue that electronic circuit designers have to cope with.

In particular, a source of electromagnetic emissions in electronic circuits are signals subjected to relatively fast transients. For example, in digital electronic circuits, clock signals, data buses, address buses and control signals are typically subjected to sharp-edge transitions. Electromagnetic radiation is primarily associated with the fundamental, the third and the fifth harmonics of these signals.

The problem of electromagnetic emissions is exacerbated by the constant increase in performance of electronic apparatuses, translating into increasingly higher clock speeds in the electronic circuits: by way of example, in the past few years microprocessor clock rates have experienced an impressive ramp-up.

Classical techniques for reducing electromagnetic emissions by electronic apparatuses, including for example coaxial wires, shielded cables, shielded casings, shielding paints, are directed to contain the generated electromagnetic radiation, more than to limit the level thereof. The main drawbacks of these techniques are bulkiness, relatively high cost, and scarce flexibility.

A more recent and quite effective technique for reducing the level of electromagnetic emissions by acting directly on the source of the electromagnetic radiation is spread-spectrum modulation of fast-varying signals, or, shortly, Spread-Spectrum Technique (SST). According to the SST, the fast-varying signal is modulated in frequency, in a carefully controlled way, so that the spectral energy of the signal is spread over a wider frequency range, and thus the spectral energy peaks are attenuated.

It has been experimentally proved that using the SST, the level of electromagnetic emissions can be lowered to an extent ranging from 5 dB to 20 dB, depending on the degree of modulation of the fast-varying signals.

The SST is mainly applied to square-wave signals, such as clock signals encountered in several digital electronic circuits. Spreading the spectral energy of the fundamental harmonic over a tightly controlled frequency range also causes the spectral energy of the higher harmonics to be distributed over a wider frequency range.

In the practical implementation of the SST, care needs to be adopted to ensure that the inevitable change in the clock signal frequency is totally transparent to the electronic circuit or system; in particular, it is important to ensure that both cycle-to-cycle jitter and peak-to-peak jitter remain within the electronic circuit or system specifications.

Phase-Locked Loop (PLL) circuits are typically used for generating clock signals of desired frequencies starting from a reference clock signal, produced for example by a crystal oscillator. Several solutions have been proposed for implementing the SST in a PLL clock signal generator. Generally stated, all these solutions involve acting in some way on the PLL circuit in order to modulate in frequency the generated clock signal.

For example, in the U.S. Pat. No. 5,631,920 different embodiments of a spread-spectrum clock generator are described. In one embodiment, two Voltage-Controlled Oscillators (VCOs) are used, one inserted in a conventional PLL and another driven by a signal that is the sum of the PLL output signal and of a modulation signal; in another embodiment, the reference frequency inputted to the PLL is varied; in still another embodiment, a variable-divide factor frequency divider is used in the feedback path of the PLL.

In the U.S. Pat. No. 6,294,936, modulation is achieved by injecting a modulation signal into the PLL's VCO.

The Applicant has observed that a problem with this technique is that it does not enable to carefully control the modulation amount; the VCO gain is in fact hardly predictable, especially in integrated circuits, because it depends on several parameters such as the temperature.

In the U.S. Pat. No. 5,943,382, a dual-loop spread-spectrum clock generator is described, with a master PLL and a slave voltage-locked loop producing a modulated voltage which is added to a voltage produced by the phase comparator of the master PLL for driving the VCO.

Also in this case, the modulation index is poorly controlled.

The Applicant has observed that in the prior-art spread-spectrum clock generators that relies on a PLL, with a modulation signal directly driving the VCO, the modulation index cannot be tightly controlled, because the loop, due to the relatively narrow bandwidth, does not work in locked condition; the continuous variation of the clock frequency causes the PLL to be always in a capture transient.

SUMMARY OF THE INVENTION

In view of the state of the art outlined above, it has been an object of the present invention to provide a clock signal generator having low electromagnetic emissions.

In particular, it has been an object of the present invention to provide a spread-spectrum clock signal generator with a highly-controllable modulation depth.

According to the present invention, this and other objects have been attained by means of a spread-spectrum clock signal generator as set forth in the appended claim 1.

In summary, the spread-spectrum clock signal generator comprises a circuit loop receiving a reference signal at a reference frequency and generating an output signal at an output frequency dependent on the reference frequency.

A modulator circuit generates a modulation signal at a modulation frequency, which is injected into the circuit loop so as to induce a modulation of the frequency of the output signal.

The circuit loop is adapted to make said output frequency equal to a first output frequency value when the modulator signal is absent, while in presence of the modulation signal the output frequency varies with respect to the first output frequency value according to the modulation signal.

In particular, the circuit loop is a frequency-locked loop and has a bandwidth sufficiently higher than the modulation frequency, so that the output frequency tracks the modulation signal.

Additionally, a frequency-offset correction arrangement is provided for evaluating a frequency offset between an average of the output frequency and said first output frequency value, and for generating a frequency-offset correction signal which is injected into the circuit loop for correcting the evaluated frequency offset.

BRIEF DESCRIPTION OF THE DRAWINGS

The features and advantages of the present invention will be made apparent by the following detailed description of some embodiments thereof, provided merely by way of non-limitative example, which will be made in connection with the attached drawings, wherein.

DETAILED DESCRIPTION OF THE PREFERRED EMBODIMENT

Figure 1:
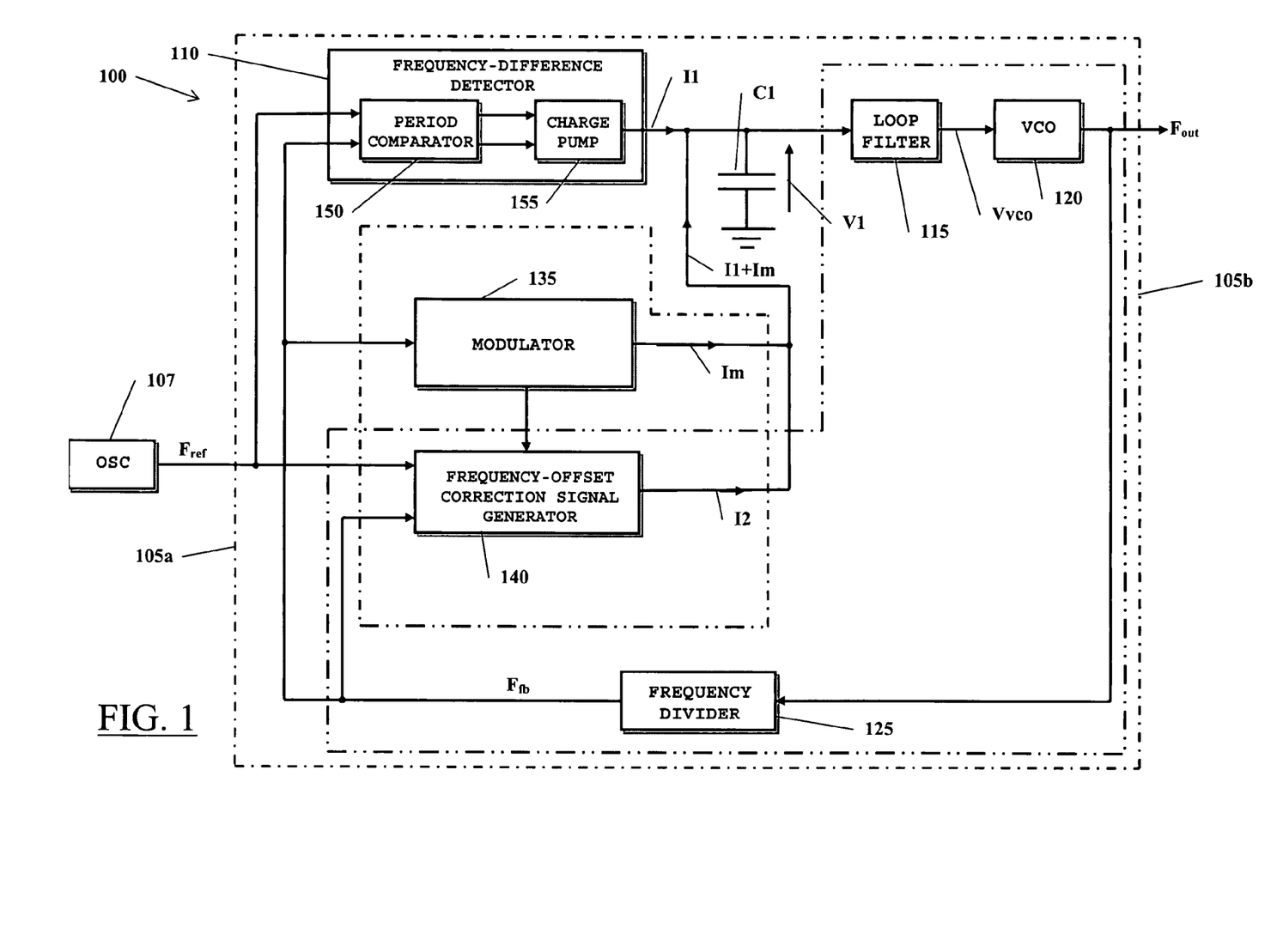
FIG. 1 is a circuit diagram of a spread-spectrum clock signal generator according to an embodiment of the present invention.

With reference to the drawings, FIG. 1 schematically shows a spread-spectrum clock signal generator according to an embodiment of the present invention, globally indicated as 100.

The clock signal generator 100 comprises a first circuit loop 105a, in the drawing circumscribed by dash-and-dot lines. The first circuit loop 105a includes a frequency-difference detector 110 that receives a reference signal Fref, oscillating at a prescribed frequency Fref (in the following, the reference frequency), and a feedback signal Ffb. The reference signal Fref is for example generated by a local oscillator 107, e.g. a crystal oscillator. The frequency-difference detector 110 is sensitive to the frequency difference between the reference signal Fref and the feedback signal Ffb, and generates a signal I1, particularly a current signal, which, on average, has a value proportional to the frequency difference between the reference signal Fref and the feedback signal Ffb. A frequency-difference detector 110 according to one embodiment of the present invention will be described in detail in the following.

The current signal I1 is fed to a capacitor C1, and contributes to the capacitor charge/discharge. A voltage signal V1 across the capacitor C1 is fed to a loop filter 115, typically a low-pass filter.

The output of the loop filter 115 forms a control or drive voltage Vvco for a Voltage Controlled Oscillator (VCO) 120. The VCO 120 generates an output signal Fout, forming the PLL output, i.e. the desired clock signal; the output signal Fout has an oscillation frequency Fout that depends on the VCO drive voltage Vvco.

The PLL output signal Fout is fed to a feedback frequency divider 125; the frequency divider 125 is for example a divide-by-N frequency divider, where N is an integer; the value N can be either fixed or user-programmable. The output of the frequency divider 125 forms the feedback signal Ffb, which is fed to the frequency-difference detector 110 to be compared to the reference signal Fref. The feedback signal Ffb has therefore an oscillation frequency Ffb equal to Fout/N, i.e., the frequency of the output signal divided by the frequency divider divide factor N.

Figure 5:
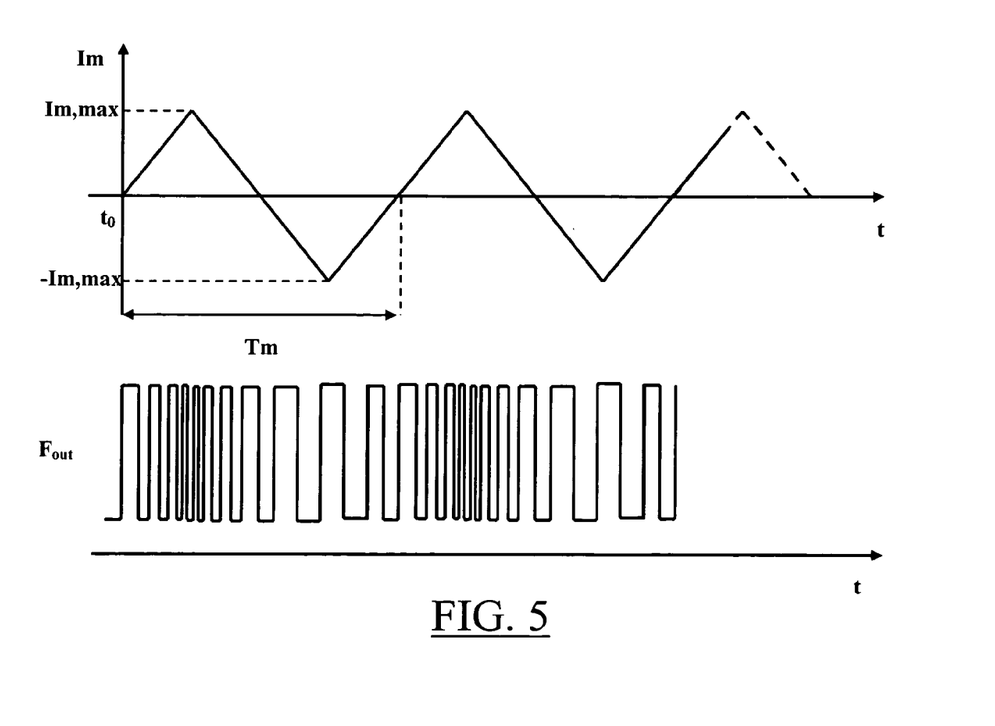
FIG. 5 is a time diagram schematically showing a modulation current generated by the modulator circuit of FIG. 4, and a resulting frequency-modulated clock signal, in an embodiment of the present invention.

A signal modulator circuit 135 is also provided, generating a modulation signal that is used for frequency-modulating the output signal Fout. In particular, in the shown embodiment of the present invention, the signal modulator circuit 135 generates a current modulation signal, or modulation current Im, varying in time according to a prescribed modulation pattern (for example, the exemplary triangular pattern shown in FIG. 5). The modulation current Im is added to the current signal I1, indicative of the frequency difference between the signals Fref and Ffb, generated by the frequency-difference detector 110. Thus, the modulation current Im contributes, together with the current signal I1, to charging/discharging the capacitor C1 and, consequently, the modulation current Im affects the value of the voltage signal V1 across the capacitor C1. The modulator circuit 135 directly drives the VCO 115: the modulation current Im, being directly injected into first circuit loop 105a, causes the VCO drive voltage Vvco to depend thereon; as a result, the frequency Fout of the output signal Fout, i.e. the desired spread-spectrum clock signal, is modulated according to the value of the modulation current Im: in particular, assuming that the modulation pattern is periodic, the modulation period of the output signal Fout is equal to the period (indicated as Tm in FIG. 5) of the modulation current Im; the modulation index depends instead on the peak-to-peak value of the modulation current Im. Referring to FIG. 5, starting from the instant t0, the instantaneous frequency Fout of the output signal Fout increases with the increase in the modulation current Im, reaching a maximum Fout,max in correspondence of the positive peak modulation current Im,max. Then, the instantaneous frequency Fout decreases with the decrease in the modulation current Im, reaching a minimum Fout,min in correspondence of the negative peak modulation current −Im,max (assumed for the sake of simplicity to be equal and opposite to the positive peak modulation current). The frequency modulation imparted to the output signal Fout allows spreading the frequency spectrum of the output signal Fout to lower and higher frequencies with respect to the frequency of the output signal Fout in absence of the frequency modulation (the average frequency, or center frequency), equal to N times the reference frequency Fref.

In addition to the first circuit loop 105a and the modulator circuit 135, the spread-spectrum clock signal generator 100 comprises a second circuit loop 105b, shown in the drawing as circumscribed by dash-and-double dots lines.

The second circuit loop 105b includes a frequency-offset correction signal generator 140, that receives the reference signal Fref and the feedback signal Ffb; alternatively, instead of the feedback signal Ffb, the frequency-offset correction signal generator 140 may receive the output signal Fout; in this case, the frequency-offset correction signal generator 140 additionally performs on the incoming output signal Fout a frequency division by a factor equal to the factor N of the frequency divider 125. The frequency-offset correction signal generator 140 generates a frequency-offset correction signal, particularly a current signal I2, that is indicative of a frequency offset between a properly time-averaged value of the feedback signal frequency Fout/N, i.e. the frequency Fout of the output signal Fout divided by the division factor N, and the reference frequency Fref. The current signal I2 is added to the modulation current Im, generated by the modulator circuit 135, and to the current I1, generated by the frequency-difference detector 110. The current signal I2 is thus fed to the capacitor C1, and contributes to the capacitor charge/discharge.

The second circuit loop 105b further includes the loop filter 115 and the VCO 120 and, in the case the frequency-offset correction signal generator 140 is fed with the feedback signal Ffb, the frequency divider 125): these elements are therefore common to the first and the second circuit loops 105a and 105b.

It can be appreciated that all the three current signals I1, I2 and Im contribute to charging/discharging the capacitor C1, and thus each one of these signals affects the voltage signal V1. Consequently, the VCO drive voltage Vvco, and thus the instantaneous frequency Fout of the output signal Fout, depends on each of the three currents I1, I2 and Im.

As depicted in FIG. 1, in an embodiment of the present invention the frequency-difference detector 110 comprises a circuit (hereinafter referred to as period comparator) 150 capable of comparing the period of the incoming signals Fref and Ffb, and a charge-pump circuit 155, controlled by the period comparator 150 and generating the current signal I1.

Figure 2:
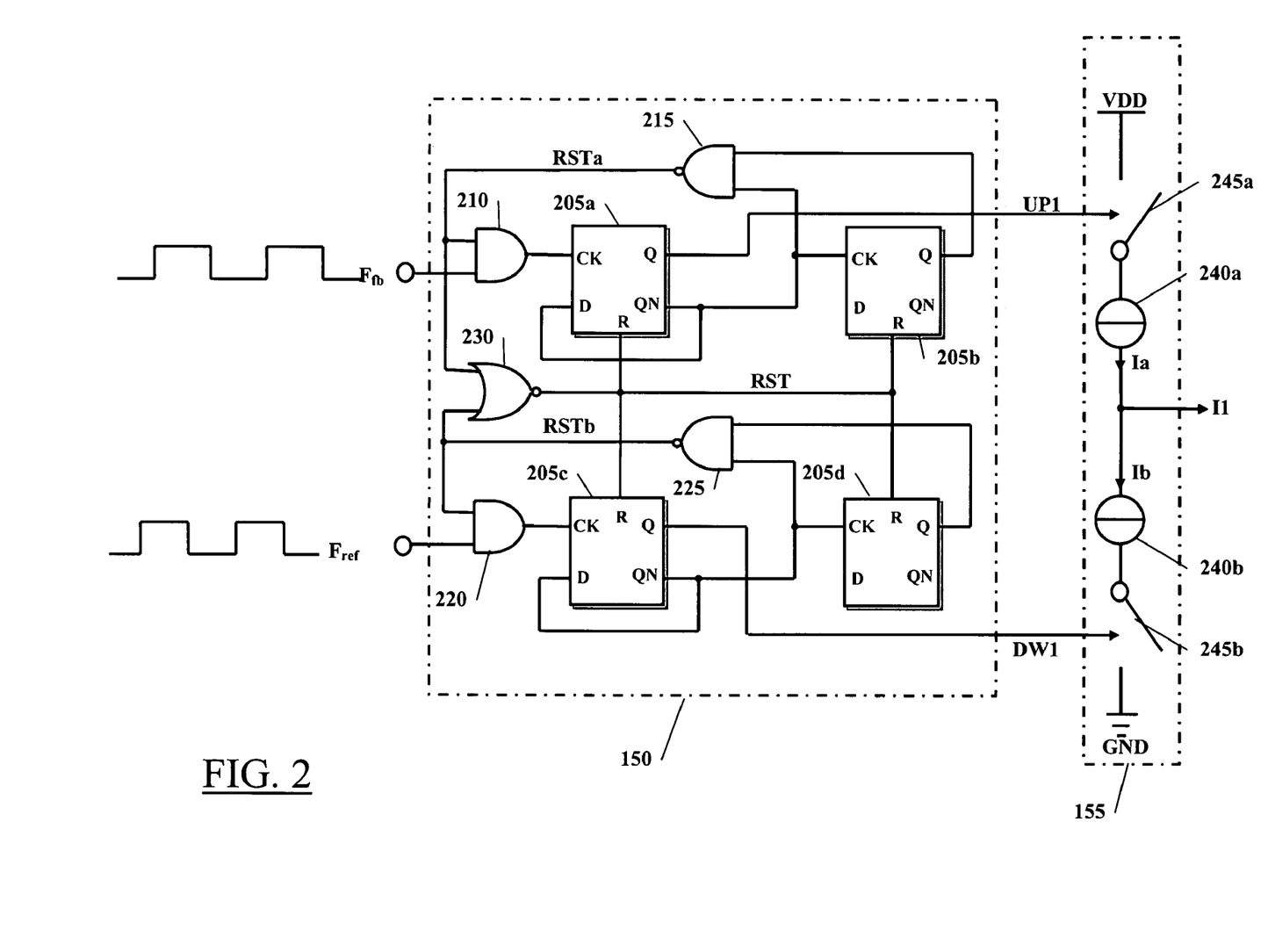
FIG. 2 schematically shows a frequency-difference detector of the spread-spectrum clock signal generator of FIG. 1, in an embodiment of the present invention.

FIG. 2 shows in greater detail the structure of the period comparator 150 and the charge-pump circuit 155, in one embodiment of the present invention.

The period comparator 150 comprises four flip-flops 205a, 205b, 205c and 205d, arranged to form two symmetric circuit branches. The flip-flops 205a to 205d have each a data input D, a data output Q, a complemented data output QN, a clock input CK, particularly sensitive to positive-edge transitions, and a clear or reset input R. The complemented data output QN of the flip-flop 205a is connected to the clock input of the flip-flop 205b, and, similarly, the complemented data output QN of the flip-flop 205c is connected to the clock input of the flip-flop 205d; the flip-flops 205b and 205d are thus clocked by the flip-flop 205a and, respectively, 205c. The flip-flop 205a receives, at the clock input CK thereof, a signal that is the logic AND (operated by an AND gate 210) of the feedback signal Ffb and a further signal RSTa being in turn the logic NAND (operated by a NAND gate 215) of the complemented data output QN of the flip-flop 205a and the data output Q of the flip-flop 205b. Symmetrically, the flip-flop 205c receives at the clock input CK thereof a signal that is the logic AND (operated by an AND gate 220) of the reference signal Fref and a further signal RSTb being in turn the logic NAND (operated by a NAND gate 225) of the complemented data output QN of the flip-flop 205c and the data output Q of the flip-flop 205d. The signals RSTa and RSTb, put in logical NOR by a NOR gate 230, generate a reset signal RST that is fed to the reset inputs of all the four flip-flops 205a to 205d.

The charge-pump circuit 155 is schematically shown as including a first and a second current generators 240a, 240b, each capable of generating a respective current Ia, Ib. Each current generator 240a, 240b is in series to a respective switch 245a, 245b, driven by a signal UP1, DW1 connected the data output Q of the flip-flop 205a, 205c. The closure of the switch 245a, 245b enables the respective current generator 240a, 240b to inject/sink the respective current Ia, Ib into/from the capacitor C1. The charge-pump output current I1 is thus equal to the difference between the current Ia and the current Ib.

In the practice, the switches 245a and 245b and the current generators 240a and 245b can be realized using MOSFETs, arranged to form current-mirror structures.

From a functional viewpoint, the circuit branch comprised of the flip-flops 205a and 205b has the purpose of generating a drive pulse UP1 for the switch 245a having a time duration equal to the period Tfb=1/Ffb of the reference signal Fref; symmetrically, the circuit branch comprised of the flip-flops 205c and 205d has the purpose of generating a drive pulse DW1 for the switch 245b having a time duration equal to the period Tref=1/Fref of the feedback signal Ffb. The operation of the period comparator 150 can be better appreciated looking at the period comparator as a state machine, and making reference to the state-transition diagram depicted in FIG. 3, wherein each possible state of the state machine is represented as a circle, within which the corresponding logic states of the flip-flops 205a, 205b, 205c and 205d are shown (according to the convention indicated in the drawing). The state machine has eight admissible states S1 to S8; transition from one state to the other is caused by a rising edge in either one of the signals Fref or Ffb, depending on the current state of the state machine. Those states of the state machine for which the state of the flip-flops 205a and 205b is equal to "10" (particularly, the states S2, S4 and S6) causes an assertion (low to high transition) of the signal UP1; similarly, those states of the state machine for which the state of the flip-flops 205c and 205d is a "10" (particularly, the states S4, S5 and S7) causes an assertion (low to high transition) of the signal DW1.

Figure 3:
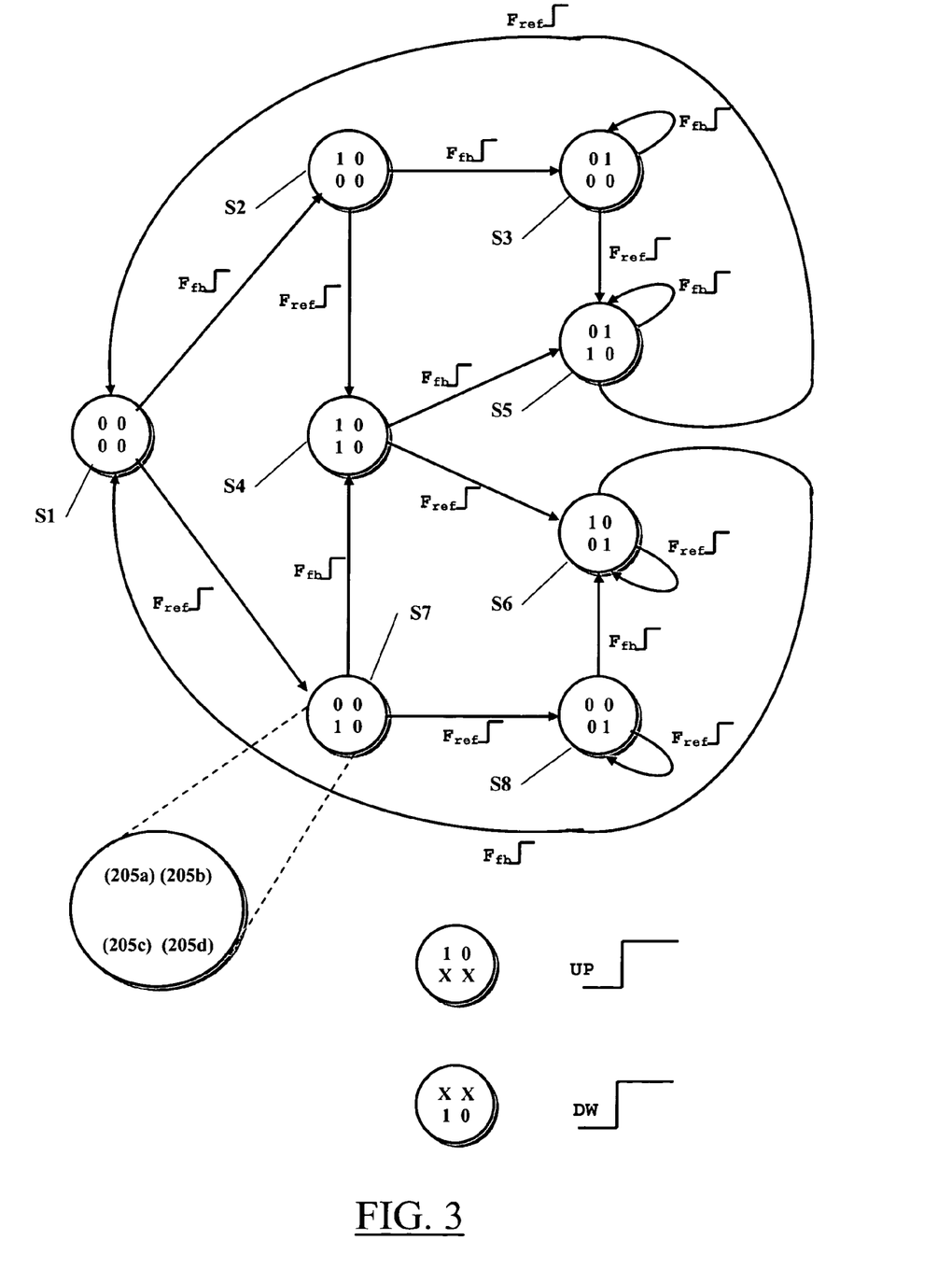
FIG. 3 is a schematic state-transition diagram illustrating the operation of the frequency-difference detector of FIG. 2.

The period comparator circuit 150 starts from a reset condition (corresponding to the state S1), in which all the four flip-flops 205a to 205d are in the "0" state. The rising edge of the feedback signal Ffb causes the assertion of the signal UP1, which remains asserted until the following rising edge of the feedback signal Ffb is detected. Similarly, the rising edge of the reference signal Fref causes the assertion of the signal DW1, which remains asserted until the following rising edge of the reference signal Fref is detected. Neither the UP1 signal nor the DW1 signal can be re-asserted before the state machine has been brought back to the reset condition.

It can be appreciated that, considering a working cycle of the period comparator 150 (where by working cycle there is intended the time necessary to return to the reset state S1), the difference between the time duration of the signal UP1 and that of the signal DW1 is exactly equal to the difference between the period of the feedback signal Ffb and that of the reference signal Fref. It is immaterial whether the signal UP1 is asserted before or after the signal DW1, i.e., it is immaterial whether the feedback signal Ffb leads or lags the reference signal Fref. In other words, the period comparator circuit 150 is not sensitive to a pure phase difference between the signals Fref and Ffb, but only to a pure difference in period.

The assertion of the signal UP1 enables the current generator 240a to inject the current Ia into the capacitor C1; similarly, the assertion of the signal DW1 enables the current generator 140*b* to sink the current Ib from the capacitor C1. Assuming that the value Ia of the current Ia is exactly equal to the value of the current Ib, the average value Iav of the current I1 that is injected into the capacitor C1 in a working cycle of the period comparator 150 is:

$$Iav = Ia \cdot \frac{Tref - Tfb}{2 \cdot \text{Max}(Tref, Tfb)}.$$

Denoting by Fε the difference between the frequency Ffb of the feedback signal Ffb and the frequency Fref of the reference signal Fref:

$$Ffb = Fref + F\epsilon,$$

it can be shown that, for small values of Fε, it is:

$$Iav \cong Ia \cdot \frac{Ffb - Fref}{Ffb + Fref} \cong Io \cdot \frac{F\varepsilon}{2Fref + F\varepsilon} \cong Io \cdot \frac{F\varepsilon}{2Fref},$$

which means that the average current Iav (and thus the total electric charge) injected into the capacitor C1 is proportional to the frequency difference between the signals Fref and Ffb, and particularly to the relative frequency difference Fε/Fref. Thus, the frequency-difference detector 110 generates a current I1 that is proportional to the pure frequency difference between the feedback signal Ffb and the reference signal Fref, irrespective of any possible phase difference: if the signals Fref and Ffb have exactly the same frequency, the value of the current I1 is zero, irrespective of the fact that these two signals are in phase or out of phase.

The first circuit loop 105*a*, if considered per-se, acts as a frequency-locked loop. Similarly to a phase-locked loop, the frequency-locked loop 105*a* is capable of generating an output signal Fout whose frequency Fout is locked to the reference frequency Fref, in particular, the frequency Fout of the output signal Fout is proportional (through the frequency-divide factor N of the frequency divider 125) to the reference frequency Fref. Additionally, the frequency Fout of the output signal Fout tracks the changes in the reference frequency Fref.

While in a phase-locked loop the quantities that are compared to each other for generating the error signal in the feedback loop are phases, in a frequency-locked loop such quantities are frequencies.

A difference of the frequency-locked loop 105*a* with respect to a phase-locked loop resides in the fact that the frequency-difference detector 110 is only sensitive to differences in frequency between the reference signal Fref and the feedback signal Ffb, while the phase or phase-frequency comparator included in a phase-locked loop is also sensitive to differences in phase between the two signals. Conventional phase-frequency comparators have output signals that, when the phase error is between π and −π, are proportional to the phase error, but for phase error values outside this range have a saw-tooth shape, positive or negative depending on whether the phase error is increasing or decreasing; this takes place for example when the phase-locked loop is not locked, and there is a significant difference between the frequency of the reference signal and that of the output signal. The phase-frequency comparator does not produce a signal proportional to the frequency difference between the reference signal and the output signal, but merely a two-valued (on/off) signal indicative of the sign of the frequency difference; in this condition, the phase-frequency comparator is very noisy, due to the saw-tooth shape of the output signal.

It is observed that in a phase-locked loop, the injection of a time-constant (i.e., DC) signal into a phase-locked loop causes a variation of the output signal phase, but no frequency variation; in a phase-locked loop, the modulation signal Im causes the output signal Fout to have a time-variable phase, not a pure frequency variation. On the contrary, in the frequency-locked loop 105*a*, the frequency Fout of the output signal varies in time tracking the modulation signal Im: the modulation index of the output signal Fout is thus kept under control.

Figure 4:
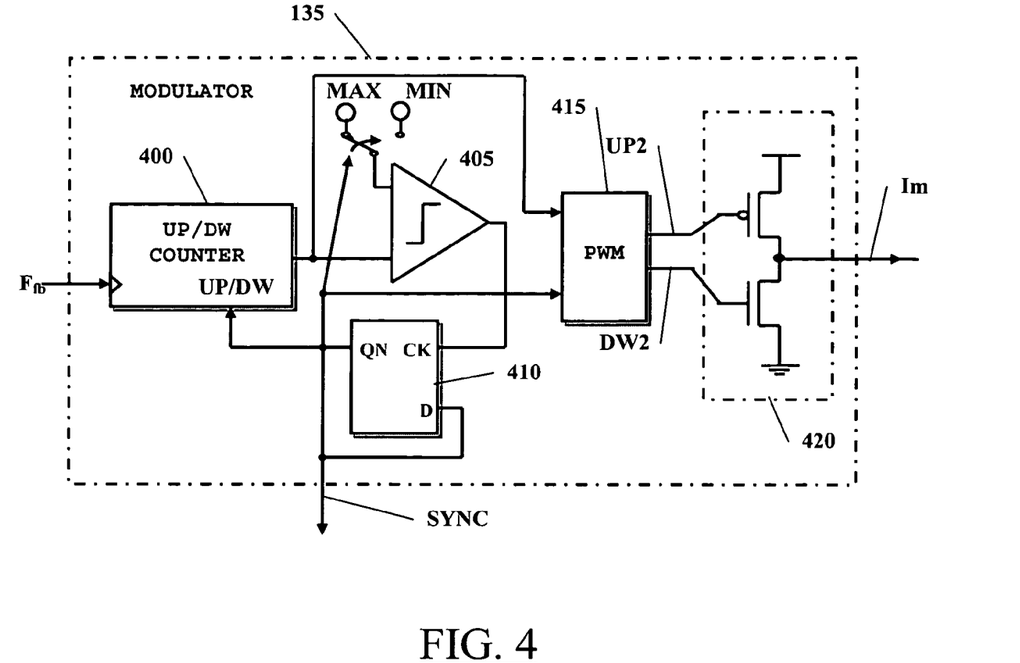
FIG. 4 is a schematic block diagram of a modulator circuit included in the spread-spectrum clock signal generator of FIG. 1, according to an embodiment of the present invention.

The modulator circuit 135 can be either an analog circuit or a digital circuit, for example a digital ramp generator driving an Analog-to-Digital Conversion (ADC) circuit. An exemplary embodiment of the modulation circuit 135 is shown in FIG. 4. An up/down counter 400 having a clock input is clocked by a clock signal, for example the feedback signal Ffb (different clock signals could in principle be used for clocking the up/down counter 400).

The up/down counter 400 feeds a first input of a comparator 405, whose second input is fed with either one of two prescribed values MAX, MIN, respectively defining a maximum and a minimum count values for the counter 400. The output of the comparator 405 clocks a clock input CK of a flip-flop 410, with a data input D connected to a complemented data output QN. The complemented data output QN of the flip-flop 410 feeds an up/down count select input UP/DW of the up/down counter 400, and also controls the supply of the first or second prescribed values MAX, MIN to the second comparator input. The up/down counter 400 and the complemented data output QN of the flip-flop 410 also feeds a Pulse Width Modulator (PWM) 415, particularly a digital PWM; the complemented data output QN determines the sign of the count value of the counter 400. The PWM 415 generates a pair of drive signals UP2 and DW2 for a charge pump 420, generating the modulation current Im.

In operation, the up/down counter 400 increments the count value at each rising edge of the feedback signal Ffb. The count value of the counter 400 is compared to the prescribed, maximum count value MAX by the comparator 405. When the counter count value exceeds the maximum value MAX, the comparator 405 switches, clocking the flip-flop 410. The complemented data output QN changes state, thereby causing the count direction to change and the second comparator input to be supplied with the prescribed value MIN. Now, at each rising edge of the feedback signal Ffb, the counter 400 decrements the count value, until the minimum count value MIN is reached. On the basis of the count value and of the state of the complemented data output QN (used as an indication of the sign of the current to be generated) the PWM 415 generates width—(i.e., time duration) modulated pulsed signals UP2, DW2, that control the current generators of the charge pump 420, so as to obtain the desired modulation current Im.

In an alternative embodiment, the PWM 205 may be replaced by a digital-to-analog converter. Alternatively, the modulator circuit 135 may include an analog oscillator, an analog ramp generator, or a look-up table (a read-only memory) with several entries pointed to by an address provided by the feedback divider, and a digital-to-analog converter for converting into an analog modulation current a digital modulation current value stored in the pointed entry of the look-up table.

Any modulation current shape can be used; in the simplest case, the modulation current Im is a periodic signal having a triangular shape as depicted in FIG. 5, a sawtooth shape, or a sinewave shape; the frequency of the modulation current may for example vary from 5 KHz to 50 KHz. The positive and/or negative peak modulation current values Im,max, −Im,max can be fixed or, preferably, programmable, so as to be able to vary the modulation index of the output frequency Fout; for example, the modulation index can range from 0 to 5%. Preferably, the modulator circuit 145 can be disabled (for example, disconnecting the output of the charge pump 420 from the first circuit loop 105*a*), so as to stop the process of modulation of the output signal Fout; in this case, the frequency Fout of the output signal Fout is not modulated.

It can be shown that, when the first circuit loop 105*a* is in the locked condition, the instantaneous shift Δf in the frequency Fout of the output signal Fout with respect to the rest frequency is:

$$\Delta f = Im/Kf \quad (eq.\ 1)$$

where Kf is used to indicate the sensitivity of the frequency-difference detector 110; the sensitivity Kf can be expressed as:

$$Kf = \frac{I_1}{2 \cdot Fref} \quad (eq.\ 2)$$

wherein I1 is the value of the output current I1 of the charge pump 155.

In fact, the loop gain Gloop of the first circuit loop 105*a* is:

$$Gloop = Kf \cdot \frac{1}{sC1} \cdot H(s) \cdot \frac{K_{VCO}}{N} \quad (eq.\ 3)$$

where $K_{VCO}$ is the gain (in rad/sec per Volts) of the VCO 135, and H(s) is the (amplitude of the) transfer function of the loop filter 115; H(s) is equal to one below the unity gain-bandwidth, so as to filter out the noise generated by the charge pump 155 in the frequency-difference detector 110.

The transfer function seen by the modulator 135 (modulation transfer function) can be written as:

$$Fout = \frac{\frac{I_M}{sC1} \cdot H(s) \cdot K_{VCO}}{1 + Kf \cdot \frac{1}{sC1} \cdot H(s) \cdot \frac{K_{VCO}}{N}} \quad (eq.\ 4)$$

Below the loop bandwidth it is:

$$Fout = \frac{I_M \cdot N \cdot Fref}{2 \cdot I_1} \quad (eq.\ 5)$$

and the modulation depth can thus be expressed as:

$$\Delta F = \frac{I_M}{I_1} \cdot \frac{Fout}{2} \quad (eq.\ 6)$$

The loop unity-gain bandwidth must be chosen sufficiently higher than the modulation frequency (i.e., higher than the frequency of the modulation current Im). For example, considering a modulation frequency of the order of 50 KHz, the bandwidth of the frequency-locked loop 105*a* is preferably equal to 500 KHz or higher. It is observed that, from a practical viewpoint, the bandwidth of the frequency-locked loop 105*a* can be made as large as $\frac{1}{10}^{th}$ of the reference frequency Fref, independently from the value of the output frequency Fout.

The relatively large bandwidth of the frequency-locked loop 105*a* ensures a fast lock, and also enables the frequency-locked loop 105*a* to operate in locked conditions even in presence of the modulation signal Im.

Since the sensitivity Kf of the frequency-difference detector 110 mainly depends on the value of the charge pump current I1, from eq. 1 above it can be appreciated that the accuracy of the frequency modulation of the output signal Fout depends on the degree of accuracy of the ratio between the modulating current Im and the current I1 of the charge pump 155. In other words, the modulation index substantially depends on a ratio of currents. Since, in the practice, the ratio between any two currents can be made process-independent and can also be rendered substantially insensible to temperature and power supply variations, much better accuracy than a conventional direct modulation of the VCO can be achieved: the free-run frequency and the sensitivity of a VCO are in fact strongly dependent on process, temperature and power supply variations.

In absence of the second circuit loop 105*b*, the output signal Fout may have a rest frequency (i.e., a long-term average frequency, or spectrum central frequency) that, instead of being stable at the desired value (for example, N times the reference frequency Fref), has an offset. Such an offset in the rest output frequency is for example due to a statistical offset that inherently affects the frequency-difference detector 110: the charge and discharge currents Ia, Ib of the capacitor C1, generated by the charge pump 155, cannot match better than a few percents. In particular, the offset in the frequency Fout of the output signal Fout depends on such a mismatch, being related thereto by the sensitivity of the period comparator 150.

The function of the second circuit loop 105*b* is to remove the offsets in the rest output frequency. In general terms, the frequency-offset correction signal generator 140 detects a long-term offset between the frequency Fout of the output signal Fout and the reference frequency Fref. On the basis of the detected long-term frequency offset, the frequency-offset correction signal generator 140 varies the value of the current signal I2. The variation of the value of the current signal I2 causes a charge/discharge of the capacitor C1, thus a change in the voltage signal V1. Consequently, also the VCO drive voltage Vvco is varied. A steady-state condition is reached when the value of the current signal I2 injected into the capacitor C1 is such as to compensate the offset of current of the charge pump 155 in the frequency-difference detector 110 that causes the long-term frequency offset in the output signal. Thus, the second circuit loop 105*b* acts as a frequency-offset correction loop.

Figure 6:
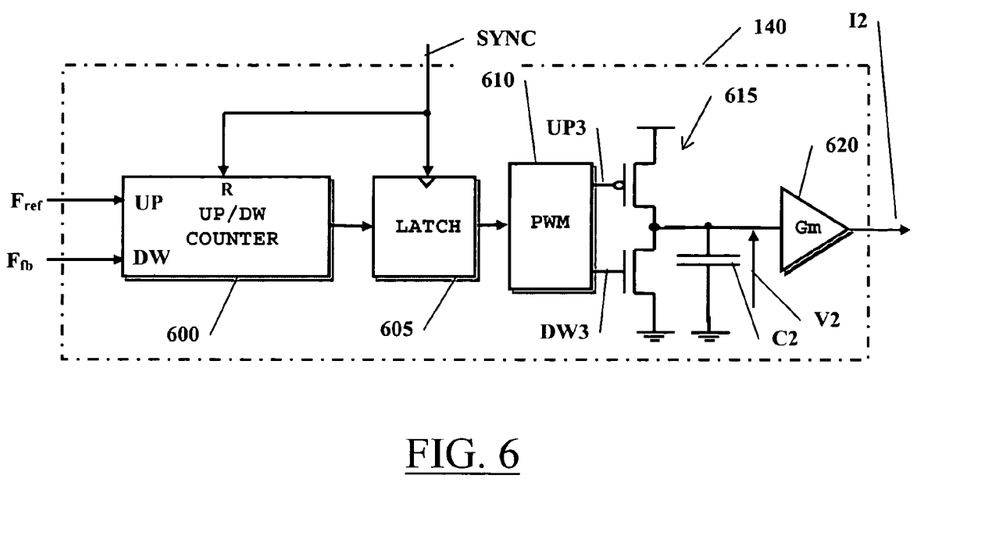
FIG. 6 schematically shows a frequency-offset correction signal generator included in the spread-spectrum clock signal generator of FIG. 1, according to an embodiment of the present invention.

FIG. 6 schematically shows the structure of the frequency-offset correction signal generator 140, according to one embodiment of the present invention. An up/down counter 600 is arranged to be clocked by both the reference signal Fref and the feedback signal Ffb (alternatively, instead of the output signal Ffb, the frequency-offset correction signal generator 140 may be receive the output signal Fout; in this case, a frequency divider having a frequency divide factor equal to N is provided, which receives the output signal Fout and generates a signal having a frequency equal to Fout/N used for clocking the up/down counter 600); the counter 600 may be sensitive to the rising edges or, alternatively, to the falling edges of the signals Fref and Ffb. In particular, the content of the counter 600 is incremented at each rising edge in the reference signal Fref, and decremented by each rising edge in the feedback signal Ffb. The counter 600 has a reset input R, driven by a reset/synchronization signal SYNC. In one embodiment of the present invention, the reset/synchronization signal SYNC is synchronous with the modulation signal Im generated by the modulator 135; for example, as visible in FIG. 4, the reset/synchronization signal SYNC reflects the state of the complemented data output QN of the flip-flop 410 in the modulator 135.

An output of the counter 600, comprised of a predetermined number of signal lines corresponding to the number of bits of the counter 600, carries the counter content, which is a signed integer. The counter output is fed to a latch register 605, adapted to be loaded with the counter content on command of the reset/synchronization signal SYNC. The value (in digital form) loaded into the latch register 605 provides an indication of the long-term frequency offset between the output signal frequency Fout and the reference frequency Fref.

The latch register 605 feeds a PWM 610 that, depending on counter content (absolute value and sign), generates pulsed drive signals UP3, DW3 for a charge pump 615. The drive signals UP3, DW3 causes the charge pump 615 to charge/discharge a capacitor C2, thereby varying a value of a voltage signal V2 across the capacitor depending on the counter content. The voltage signal V2 is fed to a voltage-to-current converter, for example a transconductance amplifier 620, which converts the voltage signal V2 into the frequency-offset correction current I2.

More generally, the frequency-offset correction signal generator 140 comprises an up/down counter caused to count in one direction by a signal equal to or derived from the reference signal Fref, and caused to count in the inverse direction by a signal equal to or derived from the output signal Fout. The counter is reset at the beginning of each period of the modulation signal Im, and the counter content is evaluated at the end of each modulation period, or with a periodicity multiple of the modulation period. In this way, at the evaluation instant, the counter content is indicative of the frequency difference between the reference signal and the output signal, expressed in terms of the difference in the number of rising or falling edges during the modulation period (or a multiple thereof).

The evaluated value, still in digital form, is then converted into an analog value, and time-integrated. Any suitable digital-to-analog conversion technique may be used, and the integration in time may even precede the digital-to-analog conversion.

When the steady-state condition is reached, the difference between the number of reference signal pulses and the number (divided by N) of output signal pulses during a modulation period (or a multiple thereof) is equal to zero.

It can be appreciated that while the frequency-locked loop 105*a* is designed to remain locked even in presence of a relatively fast (i.e., short-period) modulation signal Im, thereby the frequency modulation index of the output signal Fout is always kept under control, the frequency-offset correction loop 105*b* is not sensitive to the instantaneous value of the output signal frequency Fout, and thus does not track the relatively fast frequency variations caused by the modulation current Im.

Figure 7:
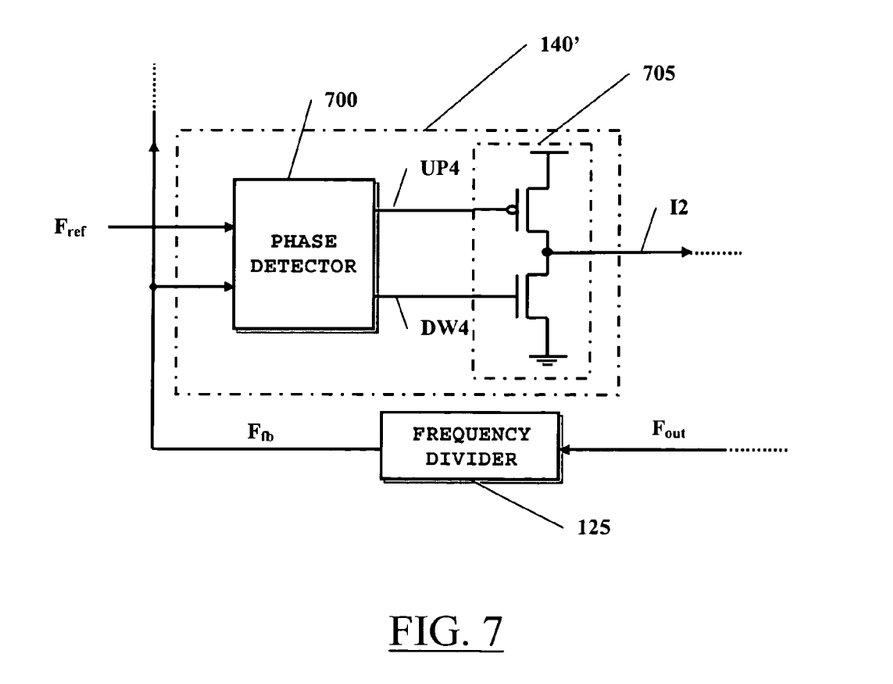
FIG. 7 schematically shows a portion of the spread-spectrum clock signal generator of FIG. 1, with a frequency-offset correction signal generator according to an alternative embodiment of the present invention.

In an alternative embodiment of the present invention, shown schematically in FIG. 7, the second circuit loop 105*b* includes a frequency-offset correction signal generator 140' that comprises a conventional phase detector 700 receiving the reference signal Fref and the feedback signal Ffb. The phase detector 700 compares the reference signal Fref and the feedback signal Ffb and generates two control signals UP4 and DW4, used to drive a charge pump 705; the resulting charge pump output current I2, which is proportional to the phase difference between the signals Fref and Ffb, is used as the frequency-offset correction signal. Thus, in this alternative embodiment of the invention, the second circuit loop 105*b* can be an analog phase-locked loop.

In this case, the frequency-locked loop 105*a* and the phase-locked loop 105*b* are designed to have different time constants, i.e., different bandwidths. In particular, the frequency-locked loop 105*a* has a first bandwidth, sufficiently higher than the modulation frequency; the phase-locked loop 105*b* has a second bandwidth, lower than the first bandwidth and, more particularly, sufficiently lower than modulation frequency. For example, considering a modulation frequency of 50 KHz, the bandwidth of the phase-locked loop 105*b* can be 500 Hz or less.

The faster frequency-locked loop 105*a* ensures a fast locking of the output signal frequency Fout; the frequency Fout of the output signal Fout can thus track the changes in the modulation current Im, ensuring that frequency-modulation index is kept controlled.

The slower phase-locked loop 105*b* acts instead as a frequency-offset correction loop, and sets the long-term central frequency of the output signal Fout against undesired offsets.

It can be appreciated that in the context of the present description, the qualifiers "slow" and "fast" for the first and second circuit loops 105*a* and 105*b* are to be construed in relation to the frequency modulation period Tm; roughly speaking, "slow" and "fast" means that the time constant of the second circuit loop 105*b* is longer and that of the first circuit loop 105*a* is shorter, respectively, than modulation period Tm.

In other words, the phase-locked loop 105*b*, due to the relatively long time constant, is insensible to the modulating current Im, and establishes the average frequency of the output signal Fout at an exact multiple of the frequency of the reference signal Fref.

An advantage of the provision of the frequency locked loop is that it allows using modulation signals which are simple in shape, because the frequency-locked loop is capable of reacting even to fast-changing modulation signals, still remaining in locked, closed loop conditions: in this conditions, the sensitivity of the circuit is substantially independent from the characteristics of the VCO, depending instead on the characteristics of the frequency comparator, which is more stable and accurate. Thus, the desired modulation index can be achieved without necessity of correcting the modulation signal in complex ways.

On the contrary, in prior-art spread-spectrum clock signal generators, based on PLLs, the injection of a signal which is slowly varying in time compared to the loop bandwidth results in a phase variation of the PLL output signal, with the same shape of the injected signal; thus, in order to modulate the frequency of the output signal, it would be necessary to inject into the PLL a modulation signal having the shape of the integral of the desired frequency variation shape; this is not easily implemented in a PLL, and requires a complex circuitry. As a matter of fact, in prior-art spread-spectrum clock signal generators, the modulation signal that is injected into the loop is fast with respect to the PLL bandwidth, and as a consequence the PLL does not respond to the modulation signal.

Thanks to the present invention, the modulation index of the output signal Fout, i.e. of the generated clock signal, can be made predictable and independent from process parameter variations and from temperature.

The spread-spectrum clock signal generator according to the present invention can be exploited in any context requiring the generation of high-frequency clock signals, such as personal computers, workstations, videogame consoles, multimedia devices, printers.

Although the present invention has been disclosed and described by way of some embodiments, it is apparent to those skilled in the art that several modifications to the described embodiments, as well as other embodiments of the present invention are possible without departing from the scope thereof as defined in the appended claims.

What is claimed is:

1. A spread-spectrum clock signal generator comprising:
   a first circuit loop, receiving a reference signal at a reference frequency and generating an output signal at an output frequency dependent on the reference frequency; and
   a second circuit loop comprising a modulator circuit generating a modulation signal (Im) at a modulation frequency, the modulation signal being injected into the first circuit loop so as to induce a modulation of the frequency of the output signal,
   the first circuit loop being adapted to make said output frequency equal to a first output frequency value when the modulator signal is absent, while in presence of the modulation signal the output frequency varies with respect to the first output frequency value according to the modulation signal,
   wherein the first circuit loop is a frequency-locked loop and has a bandwidth sufficiently higher than the modulation frequency, so that the output frequency tracks the modulation signal, and
   wherein a third circuit loop is provided comprising a frequency-offset correction arrangement for evaluating a frequency offset between an average of the output frequency and said reference frequency, and for generating a frequency-offset correction signal which is injected into the first circuit loop for correcting the evaluated frequency offset.

2. The spread-spectrum clock signal generator of claim 1, in which said circuit loop comprises:
   a frequency-difference detector arrangement, receiving the reference signal and a feedback signal corresponding to the output signal, and generating a frequency-difference signal sensitive to a pure frequency difference between the reference signal and the output signal;
   a controlled oscillator controlled by an oscillator control signal derived from the frequency-difference signal, and generating the output signal, the output frequency being determined by the oscillator control signal; and
   a feedback circuit path for deriving the feedback signal from the output signal.

3. The spread-spectrum clock signal generator of claim 2, in which the modulation signal and the frequency-offset correction signal are injected into the frequency-locked loop in such a way to condition the oscillator control signal.

4. The spread-spectrum clock signal generator of claim 3, in which said third circuit loop comprises:
   a frequency-offset correction signal generator receiving the reference signal and an additional feedback signal derived from the output signal and generating frequency-offset correction signal injected into the first circuit loop;
   the controlled oscillator, and
   an additional feedback path for deriving the additional feedback signal from the output signal.

5. The spread-spectrum clock signal generator of claim 4, in which the frequency-offset correction signal generator comprises:
   a digital counter adapted to count in a first or in a second direction in response to the reference signal or to the additional feedback signal, respectively;
   an evaluation arrangement for evaluating a digital count value present in the digital counter at prescribed time intervals; and
   a digital-to-analog converter for generating the frequency-offset correction signal starting from the evaluated count value.

6. The spread-spectrum clock signal generator of claim 5, in which the digital count value present in the digital counter is evaluated synchronously with the modulation signal.

7. The spread-spectrum clock signal generator of claim 4, in which the third circuit loop is a phase-locked loop, and the frequency-offset correction signal generator includes a phase detector for generating a phase error signal indicative of a phase difference between the reference signal and the additional feedback signal, the frequency-offset correction signal being derived from the phase error signal.

8. The spread-spectrum clock signal generator of claim 7, in which the phase-locked loop has a bandwidth sufficiently lower than the modulation frequency, so that the phase-locked loop is insensitive to the modulation signal.

9. The spread-spectrum clock signal generator of claim 8, in which the additional feedback path coincides with the feedback path.

10. A method of generating a clock signal, comprising:
    providing a reference signal at a reference frequency to a first, frequency-locked circuit loop, for generating the clock signal in such a way that a frequency of the clock signal depends on and is locked to the reference frequency;
    generating a modulation signal in a second circuit loop, and injecting the modulation signal into the first frequency-locked circuit loop for inducing a modulation of the frequency of the clock signal; the first circuit adapted to make the frequency of the clock signal equal to a first output frequency value when the modulation signal is absent, while in the presence of the modulation signal the frequency of the clock signal varies with respect to the first output frequency value according to the modulation signal;
    in a third circuit loop, evaluating a frequency offset between an average frequency of the clock signal and the reference frequency, generating a corresponding correction signal depending on the evaluated offset and injecting the correction signal into the first circuit loop for compensating the evaluated frequency offset.

* * * * *